United States Patent [19]

Behrens

[11] Patent Number: 5,309,033
[45] Date of Patent: May 3, 1994

[54] CIRCUIT ARRANGEMENT WHICH COMPENSATES FOR PULSE-DURATION CHANGES IN A BINARY SIGNAL

[75] Inventor: Michael Behrens, Nurnberg, Fed. Rep. of Germany

[73] Assignee: U.S. Philips Corporation, New York, N.Y.

[21] Appl. No.: 951,373

[22] Filed: Sep. 25, 1992

Related U.S. Application Data

[63] Continuation of Ser. No. 614,334, Nov. 15, 1990, abandoned.

[30] Foreign Application Priority Data

Nov. 20, 1989 [DE] Fed. Rep. of Germany ....... 3938459

[51] Int. Cl.$^5$ .......................... G06G 7/10; H03K 5/01
[52] U.S. Cl. .................... 307/265; 307/268; 307/354; 307/491; 328/164; 328/165
[58] Field of Search ............... 307/265, 268, 354, 443, 307/491, 594; 328/164–165

[56] References Cited

U.S. PATENT DOCUMENTS

| | | | |
|---|---|---|---|
| 3,177,433 | 4/1965 | Simon et al. | 307/265 |
| 3,254,233 | 5/1966 | Kobayashi et al. | 307/268 |
| 4,149,179 | 4/1979 | Wilcox | 307/354 |
| 4,419,596 | 12/1983 | Kikuchi | 307/594 |
| 4,591,745 | 5/1986 | Shen | 307/594 |
| 4,630,046 | 12/1986 | Rein | 340/825 |
| 4,667,320 | 5/1987 | Onno et al. | 370/58 |
| 4,687,949 | 8/1987 | Yasuda | 307/594 |
| 4,700,089 | 10/1987 | Fujii et al. | 307/594 |
| 4,710,653 | 12/1987 | Yee | 307/602 |
| 4,902,907 | 2/1990 | Haga et al. | 307/594 |

OTHER PUBLICATIONS

Steinbuch and Rupprecht: Nachirichtentechnik, Springer-Verlag Berlin/Heidelberg/New York, (1967), pp. 113-118.

Primary Examiner—Margaret R. Wambach
Attorney, Agent, or Firm—Steven R. Biren

[57] ABSTRACT

A circuit arrangement compensates for changes of pulse-duration in a binary signal. These changes of pulse-duration are the consequence of parasitic reactances in the signal path of the binary signal. A compensating circuit, which owing to its simplicity is particularly suitable for integrated circuits, is characterized in that a signal is inverted by an input inverter (I1) after it has passed through the signal path, then passes through a copy (NA) of the signal path, and is inverted once again by an output inverter (I1). If the signal path and its copy are integrated on a single chip, an adjustment of the copy (NA) need not be performed. Particularly advantageous—because of its cost-effectiveness—is the implementation of the above circuit in switching networks which are realized as integrated circuits. For each output of the switching network only a single copy (NA) will then be necessary.

4 Claims, 1 Drawing Sheet

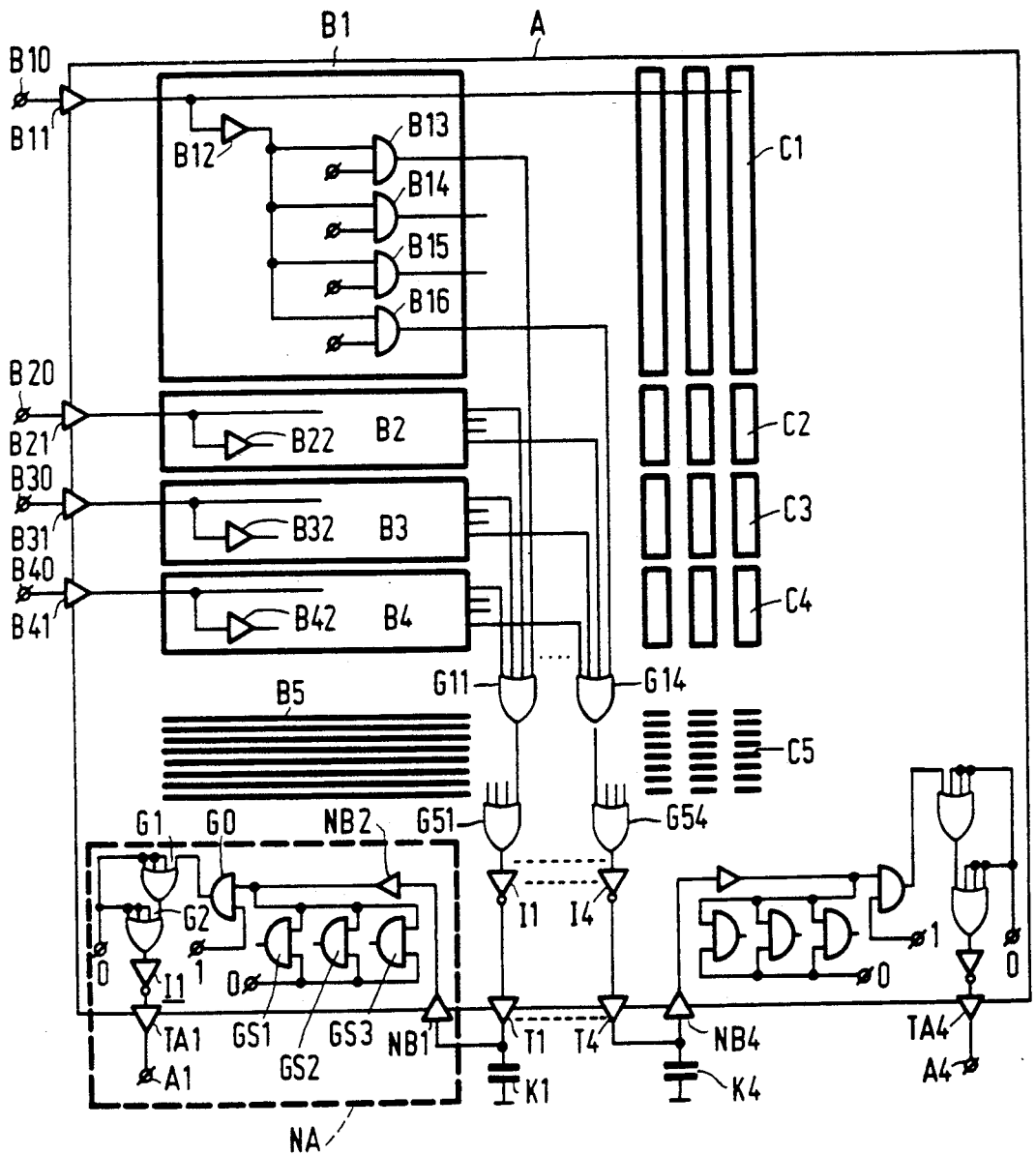

CIRCUIT ARRANGEMENT WHICH COMPENSATES FOR PULSE-DURATION CHANGES IN A BINARY SIGNAL

This is a continuation of application Ser. No. 07/614,334, filed Nov. 15, 1990 now abandoned.

BACKGROUND OF THE INVENTION

The invention relates to a circuit arrangement for compensating for changes of pulse-duration in a binary signal which are the consequence of parasitic reactances in a signal path.

Circuit arrangements for compensating for pulse distortions—thus also changes of pulse-duration—in analog technology are known (compare, for example, the text book by Steinbuch and Rupprecht: Nachrichtentechnik, Springer-Verlag Berlin/Heidelberg/New York, (1967), pp. 113 to 118). However, if one wishes to compensate for the pulse distortions which develop, for example, on signal paths in integrated circuits, analog techniques are discarded due to their space-consuming dimensions. It is conceivable though, with integrated circuits, to carry out the usual pulse regeneration by means of resampling (cf. for this purpose European patent document EP 0 160 826 B1). A different possibility would be the one through which the problem could be avoided by implementing a faster technology which, for example, can be inferred from European patent document EP 0 148 395, according to which integrated broadband switching networks are implemented in ECL technology.

SUMMARY OF THE INVENTION

It is an object of the invention to provide a compensating circuit for the purpose discussed above, which is extremely suitable for integrated circuits because of its simplicity.

This object is achieved in that the signal, after passing through the signal path, is inverted by an input inverter after which it passes through a copy of the signal path and is thereafter inverted once again by an output inverter.

According to present-day highly developed integrated circuit technology it often does not imply an increase of circuitry and cost to add a copy of the signal path as an integrated circuit. The innovative teaching is based on the recognition that a pulse, the duration of which, for example, is shortened by a signal path, will be lengthened to approximately the same extent when it is inverted and passes through the same signal path or a copy thereof once again.

If the signal path and its copy are integrated on a single chip, the adjustment of the copy will be omitted because, as is widely known, similar components integrated on a single chip also have similar electrical properties.

If the integrated circuit relates to a switching network, the implementation of the teaching according to the invention proves to be extremely cost-effective since all possible signal paths through the switching network have the same parasitic reactance and, consequently, the compensation for changes of pulse-duration can be effected for all these paths solely by a single copy.

BRIEF DESCRIPTION OF THE DRAWING

The invention will be further explained with reference to an embodiment shown in the drawing, in which the single FIGURE represents the schematic diagram of a switching network including compensating circuits according to the invention.

DESCRIPTION OF THE PREFERRED EMBODIMENT

The switching network on the integrated circuit A has sixteen inputs and as many outputs; each input can be connected to each output by means of gates. In the Figure only four of the inputs, i.e. B10, B20, B30 and B40 as well as two of the outputs, i.e. A1 and A4 are shown. The sections in bold lines B1, B2, B3, B4, C1, C2, C3 and C4 as well as B5 and C5 are sections of the integrated circuit A which have the same structure as circuit section B1.

Circuit section B1 comprises a drive circuit B12 whose output is connected to inputs of four AND gates B13, B14, B15 and B16. To the other inputs of the AND gates control signals are applied which cause the gates to open or close. In the circuit sections B2, B3 and B4 only the drive circuits B22, B32 and B42 corresponding to drive circuit B12 are shown.

Immediately after the inputs B10, B20 etcetera there are the input drive circuit B11, B21, B31, B41 etcetera in the integrated circuit. Each output of the AND gates B13, B14, B15 and B16 is connected to an input of one of four OR-gates G11 to G14; each of these OR-gates has three further inputs connected to AND-gate outputs of sections B2, B3 and B4. The twelve circuit sections B5 which are identical with the circuit section B1 are combined, each by four (not shown) OR-gates, in the same manner as sections B10, B20, B30 and B40 are combined by the four gates G11 to G14.

The circuit as a whole comprises sixteen OR-gates corresponding to the OR-gates G11 to G14, which effect the combination of the sections B1, B2, B3, B4 and B5 depicted above. The outputs of these sixteen OR-gates are again connected to inputs of four further OR-gates G51 to G54 each having four inputs. The outputs of the gates G51 to G54 are inverted by inverters I1 to I4 and applied to output terminals (not referenced) via the further drives T1 to T4. The signal which is applied to one of the inputs B10, B20, etcetera and has inverted and shortened pulses is available at this output terminal. This inverted signal is then applied to a copy NA of the signal path passed through thus far.

In the present case the copying of the signal path is facilitated because all signal paths leading from one of the inputs B10, B20 etcetera, for example, to the output of the drive T1 are equal because of their electrical properties. Consequently, only one copy NA is necessary for each drive circuit T1 to T4. It consists of an input drive NB1, which is a copy of the drive circuits B11, B21, B31, B41 etcetera, as well as a further drive circuit NB2 which is a copy of one of the drive circuits B12, B22, B32, B42 etcetera. Gate GO copies a switched AND-gate of the sections B1, B2, B3, B4 or B5; consequently, one of its inputs is connected to the output of the drive circuit NB2 and a binary one is applied to the other input. To the signal input of gate GO three blocked gates GS1, GS2 and GS3 are connected, through which the blocked gates, for example, of the sections B1 or B2 are copied. The cascade arrangement of two OR-gates having four inputs in the signal path is copied by the gates G1 and G2 from which three inputs each are connected to the potential of a binary zero.

The output of gate G2 is connected to a copy I1 of the inverter I1 and then to the copy TA1 of the drive circuit T1. The input signal which passes through the described path from one of the inputs B10 to B40 has been inverted twice and is available at output A1 with substantially undistorted pulses. However, it is presupposed that the shortening of the pulses on the signal path does not narrow down to suppression.

A capacitor K1 at the output of the drive T1 copies the capacitive load which a typical connecting line which runs from the output A1 to a next switching stage would have. The total number of copies NA on the chip represented in the Figure is sixteen. For reference purposes a second copy is shown by means of capacitor K4, drive circuit NB4 and TA4 and a terminal A4.

The copies are integrated on the same chip as the signal path. Consequently, as has already been discussed hereinbefore, the copy NA has substantially the same electrical properties as one of the possible signal paths on the chip. Therefore, except for the capacitors K1, . . . , K4 etcetera, an adjustment is not necessary.

We claim:

1. A circuit arrangement for compensating for changes in pulse duration in a binary signal which are the consequence of parasitic reactances in a multi-stage signal path, comprising an input inverter (I1) having an input coupled to the output of said signal path and an output, a circuit (NA) comprising a copy of the multi-stage signal path having the same parasitic reactances as said multi-stage signal path and having an input coupled to the output of said input inverter (I1) and an output, and an output inverter (I1) having an input coupled to the output of said circuit (NA) and an output for providing a compensated signal.

2. A circuit arrangement as claimed in claim 1, characterized in that the signal path, its copy (NA), as well as the input and output inverters (I1, I1), are integrated on a single chip.

3. A circuit arrangement as claimed in claim 2, characterized in that the coupling between the input inverter (I1) and input of the circuit (NA) comprises a connection of the single chip, which is coupled to a reference potential via a capacitor (K1).

4. A circuit arrangement as claimed in claim 2 or 3, characterized in that the single chip comprises a switching network and in that one circuit (NA) is provided for each output of the switching network.

* * * * *